US012166099B2

(12) United States Patent
Zhu et al.

(10) Patent No.: US 12,166,099 B2
(45) Date of Patent: Dec. 10, 2024

(54) METHODS FOR FORMING A SEMICONDUCTOR DEVICE STRUCTURE AND RELATED SEMICONDUCTOR DEVICE STRUCTURES

(71) Applicant: ASM IP Holding B.V., Almere (NL)

(72) Inventors: Chiyu Zhu, Helsinki (FI); Kiran Shrestha, Phoenix, AZ (US); Petri Raisanen, Gilbert, AZ (US); Michael Eugene Givens, Oud-Heverlee (BE)

(73) Assignee: ASM IP Holding B.V., Almere (NL)

( * ) Notice: Subject to any disclaimer, the term of this patent is extended or adjusted under 35 U.S.C. 154(b) by 0 days.

(21) Appl. No.: 18/217,739

(22) Filed: Jul. 3, 2023

(65) Prior Publication Data
US 2023/0352556 A1    Nov. 2, 2023

Related U.S. Application Data

(63) Continuation of application No. 17/411,306, filed on Aug. 25, 2021, now Pat. No. 11,695,054, which is a (Continued)

(51) Int. Cl.
*H01L 29/51* (2006.01)
*C23C 16/34* (2006.01)
(Continued)

(52) U.S. Cl.
CPC .......... *H01L 29/517* (2013.01); *C23C 16/34* (2013.01); *C23C 16/45525* (2013.01);
(Continued)

(58) Field of Classification Search
CPC ......... H01L 21/02175; H01L 21/02205; H01L 21/0228; H01L 21/28194; H01L 29/517;
(Continued)

(56) References Cited

U.S. PATENT DOCUMENTS 7,691,757 B2 * 4/2010 Haukka ............ C23C 16/45531
438/785
2005/0284370 A1 * 12/2005 Strang ............... C23C 16/45548
427/248.1

(Continued)

OTHER PUBLICATIONS

Alén, P. "Atomic Layer Deposition of TaN, NbN, and MoN Films for Cu Metallizations", Laboratory of Inorganic Chemistry, Department of Chemistry, University of Helsinki, Finland (2005).

*Primary Examiner* — Kyoung Lee
*Assistant Examiner* — Christina A Sylvia
(74) *Attorney, Agent, or Firm* — Snell & Wilmer L.L.P.

(57) ABSTRACT

Methods for forming a semiconductor device structure are provided. The methods may include forming a molybdenum nitride film on a substrate by atomic layer deposition by contacting the substrate with a first vapor phase reactant comprising a molybdenum halide precursor, contacting the substrate with a second vapor phase reactant comprise a nitrogen precursor, and contacting the substrate with a third vapor phase reactant comprising a reducing precursor. The methods provided may also include forming a gate electrode structure comprising the molybdenum nitride film, the gate electrode structure having an effective work function greater than approximately 5.0 eV. Semiconductor device structures including molybdenum nitride films are also provided.

18 Claims, 2 Drawing Sheets

Related U.S. Application Data continuation of application No. 16/924,595, filed on Jul. 9, 2020, now Pat. No. 11,164,955, which is a continuation of application No. 16/038,024, filed on Jul. 17, 2018, now Pat. No. 10,734,497.

(60) Provisional application No. 62/534,085, filed on Jul. 18, 2017.

(51) Int. Cl.
| | | |
|---|---|---|
| *C23C 16/455* | (2006.01) | |
| *H01L 21/02* | (2006.01) | |
| *H01L 21/28* | (2006.01) | |
| *H01L 29/49* | (2006.01) | |
| *H01L 29/66* | (2006.01) | |

(52) U.S. Cl.
CPC ............ *H01L 21/02175* (2013.01); *H01L 21/02205* (2013.01); *H01L 21/0228* (2013.01); *H01L 21/28194* (2013.01); *H01L 29/4966* (2013.01); *H01L 29/66568* (2013.01)

(58) Field of Classification Search
CPC .......... H01L 29/4966; H01L 29/66568; C23C 16/34; C23C 16/45525
See application file for complete search history.

(56) References Cited

U.S. PATENT DOCUMENTS

| | | | |
|---|---|---|---|
| 2008/0182410 A1* | 7/2008 | Elers | H01L 21/28562 257/E21.171 |
| 2010/0025766 A1 | 2/2010 | Nuttinck et al. | |
| 2011/0031562 A1 | 2/2011 | Lin et al. | |
| 2011/0060165 A1* | 3/2011 | Cameron | C07F 17/00 427/255.394 |
| 2013/0234148 A1* | 9/2013 | Werkhoven | H01L 21/76254 257/E29.089 |
| 2013/0309876 A1 | 11/2013 | Ogawa | |
| 2015/0162197 A1* | 6/2015 | Baek | H01L 21/266 438/275 |
| 2016/0152649 A1* | 6/2016 | Gordon | C07F 7/28 548/402 |
| 2016/0168694 A1* | 6/2016 | Min | C23C 16/44 427/255.31 |

\* cited by examiner

METHODS FOR FORMING A SEMICONDUCTOR DEVICE STRUCTURE AND RELATED SEMICONDUCTOR DEVICE STRUCTURES

CROSS-REFERENCE TO RELATED APPLICATION

This application is a continuation of, and claims priority to, U.S. patent application Ser. No. 17/411,306 filed Aug. 25, 2021 titled METHODS FOR FORMING A SEMICONDUCTOR DEVICE STRUCTURE AND RELATED SEMICONDUCTOR DEVICE STRUCTURES; which is a continuation of U.S. patent application Ser. No. 16/924,595 filed Jul. 9, 2020 titled METHODS FOR FORMING A SEMICONDUCTOR DEVICE STRUCTURE AND RELATED SEMICONDUCTOR DEVICE STRUCTURES (now U.S. Pat. No. 11,164,955 issued Nov. 2, 2021), which is a continuation of, and claims priority to, U.S. patent application Ser. No. 16/038,024 filed Jul. 17, 2018 (now U.S. Pat. No. 10,734,497) titled METHODS FOR FORMING A SEMICONDUCTOR DEVICE STRUCTURE AND RELATED SEMICONDUCTOR DEVICE STRUCTURES, which claims the benefit of U.S. Provisional Patent Application Ser. No. 62/534,085 filed Jul. 18, 2017, titled METHODS FOR FORMING A SEMICONDUCTOR DEVICE STRUCTURE AND RELATED SEMICONDUCTOR DEVICE STRUCTURES, the disclosures of which are hereby incorporated by reference in their entirety.

BACKGROUND

Field of the Invention

The present disclosure relates generally to methods for forming a semiconductor device structure including a molybdenum nitride film and related semiconductor device structures.

Description of the Related Art

Metal-oxide-semiconductor (MOS) technology has conventionally utilized n-type doped polysilicon as the gate electrode material. However, doped polysilicon may not be an ideal gate electrode material for advanced node applications. For example, although doped polysilicon is conductive, there may still be a surface region which can be depleted of carriers under bias conditions. This region may appear as an extra gate insulator thickness, commonly referred to as gate depletion, and may contribute to the equivalent oxide thickness. While the gate depletion region may be thin, on the order of a few angstroms (Å), it may become significant as the gate oxide thicknesses are reduced in advance node applications. As a further example, polysilicon does not exhibit an ideal effective work function (eWF) for both NMOS and PMOS devices. To overcome the non-ideal effective work function of doped polysilicon, a threshold voltage adjustment implantation may be utilized. However, as device geometries reduce in advanced node applications, the threshold voltage adjustment implantation processes may become increasingly complex and impractical.

To overcome the problems associated with doped polysilicon gate electrodes, the non-ideal doped polysilicon gate material may be replaced with an alternative material, such as, for example, a transition metal nitride. For example, the properties of a transition metal nitride may be modified to provide a gate electrode structure with a more ideal effective work function for both the NMOS and PMOS devices, where the effective work function of the gate electrode, e.g., the energy needed to extract an electron, must be compatible with the barrier height of the semiconductor material. For example, in the case of PMOS devices, the required effective work function is approximately 5.0 eV.

Methods and semiconductor device structures are therefore desirable that are able to provide a gate electrode structure including a transition metal nitride with appropriate physical and electrical properties.

SUMMARY

This summary is provided to introduce a selection of concepts in a simplified form. These concepts are described in further detail in the detailed description of example embodiments of the disclosure below. This summary is not intended to identify key features or essential features of the claimed subject matter, nor is it intended to be used to limit the scope of the claimed subject matter.

In some embodiments, methods for forming a forming a semiconductor device structure are provided. The methods may comprise: forming a molybdenum nitride film on a substrate by atomic layer deposition, wherein forming the molybdenum nitride film comprises; contacting the substrate with a first vapor phase reactant comprising a molybdenum halide precursor; contacting the substrate with a second vapor phase reactant comprising a nitrogen precursor selected from the group comprising ammonia ($NH_3$), hydrazine ($N_2H_4$), triazane ($N_3H_5$), tertbutylhydrazine ($C_4H_9N_2H_3$), methylhydrazine ($CH_3NHNH_2$), and dimethylhydrazine (($CH_3)_2N_2H_2$); and contacting the substrate with a third vapor phase reactant comprising a reducing precursor selected from the group comprising hydrogen gas ($H_2$), silane ($SiH_4$), disilane ($Si_2H_6$), trisilane ($Si_3H_8$), tetrasilane ($Si_4H_8$), and acetylene ($C_2H_2$); and forming a gate electrode structure comprising the molybdenum nitride film, the gate electrode structure having an effective work function greater than approximately 5.0 eV.

In some embodiments semiconductor device structures are provided. The semiconductor device structures may comprise a PMOS transistor gate structure, the PMOS transistor gate structure comprising a molybdenum nitride film and a gate dielectric disposed between the molybdenum nitride film and a semiconductor body, wherein the PMOS gate structure has an effective work function greater than 5.0 eV.

For the purpose of summarizing the invention and advantages achieved over the prior art, certain objects and advantages of the invention have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught or suggested herein without necessarily achieving other objects or advantaged as may be taught or suggested herein.

All of these embodiments are intended to be within the scope of the invention herein disclosed. These and other embodiments will become readily apparent to those skilled in the art from the following detailed description of certain embodiments having reference to the attached figures, the invention not being limited to any particular embodiment(s) disclosed.

BRIEF DESCRIPTION OF THE DRAWINGS

While the specification concludes with claims particularly pointing out and distinctly claiming what are regarded as embodiments of the invention, the advantages of embodiments of the disclosure may be more readily ascertained from the description of certain examples of embodiments of the disclosure when read in conjunction with the accompanying drawings, in which:

DETAILED DESCRIPTION

Figure 1:
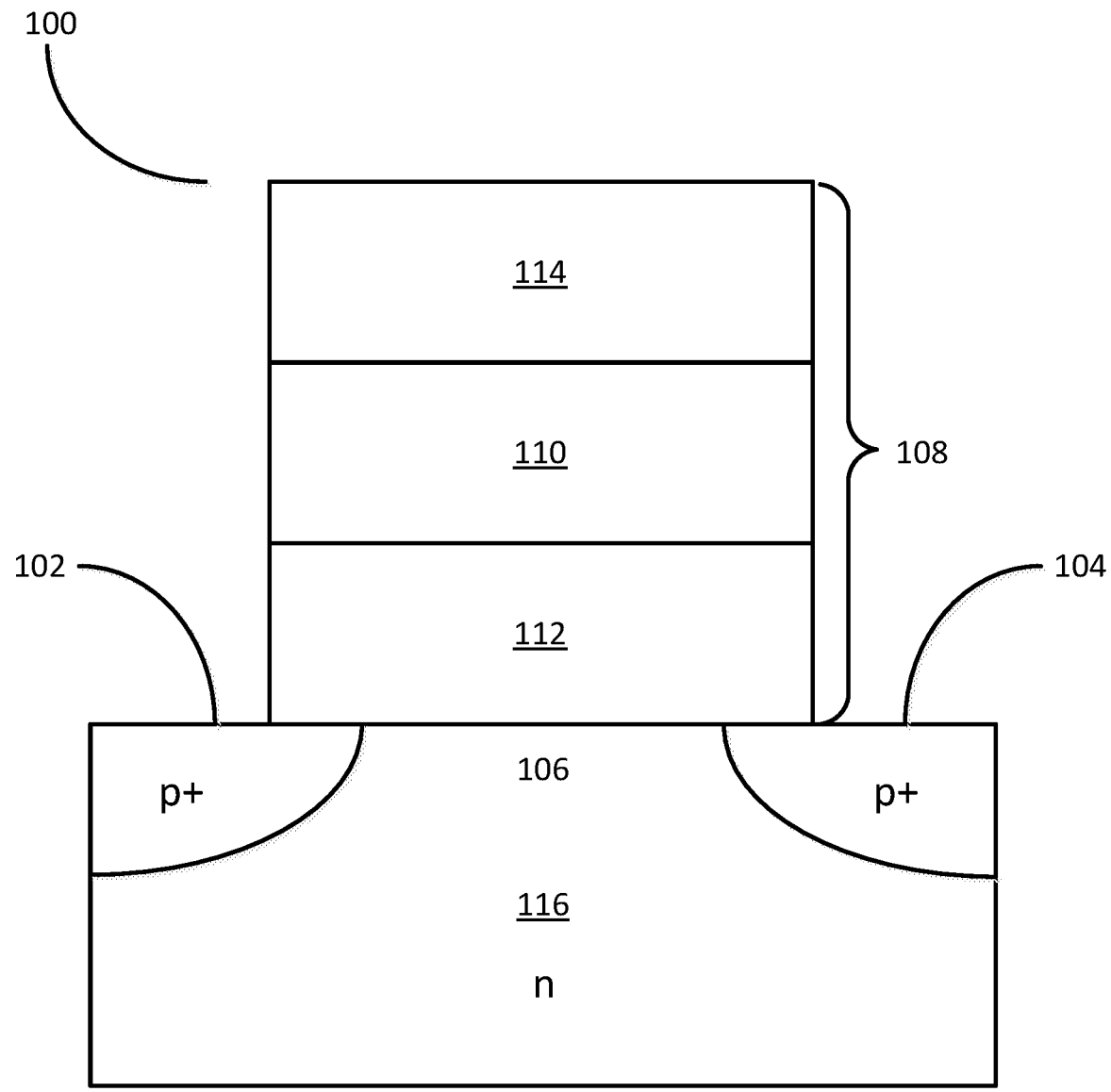
FIG. 1 is simplified cross section view of a semiconductor device structure formed according to the embodiments of the disclosure.

The illustrations presented herein are not meant to be actual view of any particular material, structure, or device, but are merely idealized representations that are used to describe embodiments of the disclosure.

As used herein, the term "atomic layer deposition" (ALD) may refer to a vapor deposition process in which deposition cycles, preferably a plurality of consecutive deposition cycles, are conducted in a process chamber. Typically, during each cycle, the precursor is chemisorbed to a deposition surface (e.g., a substrate surface or a previously deposited underlying surface such as material from a previous ALD cycle), forming a monolayer or sub-monolayer that does not readily react with additional precursor (i.e., a self-limiting reaction). Thereafter, if necessary, a reactant (e.g., another precursor or reaction gas) may subsequently be introduced into the process chamber for use in converting the chemisorbed precursor to the desired material on the deposition surface. Typically, this reactant is capable of further reaction with the precursor. Further, purging steps may also be utilized during each cycle to remove excess precursor from the process chamber and/or remove excess reactant and/or reaction byproducts from the process chamber after conversion of the chemisorbed precursor. Further, the term "atomic layer deposition," as used herein, is also meant to include processes designated by related terms such as, "chemical vapor atomic layer deposition", "atomic layer epitaxy" (ALE), molecular beam epitaxy (MBE), gas source MBE, or organometallic MBE, and chemical beam epitaxy when performed with alternating pulses of precursor composition(s), reactive gas, and purge (e.g., inert carrier) gas.

As used herein, the term "substrate" may refer to any underlying material or materials that may be used, or upon which a device, a circuit or a film may be formed.

A subscript "x" for the molybdenum nitride film (e.g., $MoN_x$) may be used to designate that the molybdenum nitride is not necessarily stoichiometric, having a wide range of phases, with varying molybdenum/nitrogen ratios.

The present disclosure includes methods for forming semiconductor device structures and the semiconductor device structures themselves that include a molybdenum nitride film formed by an atomic layer deposition process. The methods of the disclosure may include utilizing the molybdenum nitride film as a component of a gate electrode structure thereby forming a gate electrode structure with an effective work function more suitable for PMOS device structures. The disclosure may also include methods for forming gate electrode structures comprising thin film molybdenum nitride films with increased effective work function in addition to reduced electrical resistivity. For example, the effective work function of a gate electrode structure may vary as a function of its thickness, i.e., the effective work function of the gate electrode structure may decrease or increase with decreasing thickness of the materials comprising the gate electrode. As device geometries decrease in advanced node applications, the thickness of the corresponding device films, for example, such as the gate electrode, may also decrease with a corresponding change in the effective work function of the film. Such a change in the effective work function of the gate electrode at reduced thickness may result in a non-ideal effective work function for PMOS device structures. Methods and semiconductor device structures are therefore required to provide a more desirable molybdenum nitride film. Examples of such methods and semiconductor devices structures are disclosed in further detail below.

ALD is based on typically self-limiting reactions, whereby sequential and alternating pulses of reactants are used to deposit about one atomic (or molecular) monolayer of material per deposition cycle. The deposition conditions and precursors are typically selected to provide self-saturating reactions, such that an adsorbed layer of one reactant leaves a surface termination that is non-reactive with the gas phase reactants of the same reactant. The substrate is subsequently contacted with a different reactant that reacts with the previous termination to enable continued deposition. Thus, each cycle of alternated pulses typically leaves no more than about one monolayer of the desired material. However, as mentioned above, the skilled artisan will recognize that in one or more ALD cycles more than one monolayer of material may be deposited, for example if some gas phase reactions occur despite the alternating nature of the process.

In an ALD-type process for depositing molybdenum nitride films ($MoN_x$), one deposition cycle may comprise exposing the substrate to a first reactant, removing any unreacted first reactant and reaction byproducts from the reaction space and exposing the substrate to a second reactant, followed by a second removal step. The first reactant may comprise a molybdenum precursor and the second reactant may comprise a nitrogen precursor.

Precursors may be separated by inert gases, such as argon (Ar) or nitrogen ($N_2$), to prevent gas-phase reactions between reactants and enable self-saturating surface reactions. In some embodiments, however, the substrate may be moved to separately contact a first vapor phase reactant and a second vapor phase reactant. Because the reactions self-saturate, strict temperature control of the substrates and precise dosage control of the precursors is not usually required. However, the substrate temperature is preferably such that an incident gas species does not condense into monolayers nor decompose on the surface. Surplus chemicals and reaction byproducts, if any, are removed from the substrate surface, such as by purging the reaction space or by moving the substrate, before the substrate is contacted with the next reactive chemical. Undesired gaseous molecules can be effectively expelled from a reaction space with the help of an inert purging gas. A vacuum pump may be used to assist in the purging.

According to some embodiments, ALD processes are used to form molybdenum nitride films on a substrate, such as an integrated circuit workpiece. In some embodiments of the disclosure each ALD cycle comprises two distinct deposition steps or phases. In a first phase of the deposition cycle ("the molybdenum phase"), the substrate surface on which deposition is desired is contacted with a first vapor phase reactant comprising a molybdenum precursor which chemisorbs onto the substrate surface, forming no more than about one monolayer of reactant species on the surface of the substrate.

In some embodiments, the molybdenum precursor, also referred to herein as the "molybdenum compound," may comprise a molybdenum halide and the adsorbed monolayer may be terminated with halogen ligands. The molybdenum precursor may therefore comprise a molybdenum chloride which may further comprise at least one of molybdenum trichloride ($MoCl_3$), molybdenum tetrachloride ($MoCl_4$), molybdenum pentachloride ($MoCl_5$), or molybdenum hexachloride ($MoCl_6$). The molybdenum precursor may also comprise a molybdenum fluoride, such as, for example, molybdenum hexafluoride ($MoF_6$). The molybdenum precursor may further comprise a molybdenum carbonyl, such as, for example, molybdenum hexacarbonyl ($Mo(CO)_6$). In some embodiments of the disclosure, the molybdenum precursor may comprise an organic molybdenum precursor, such as, for example, tetrachloro(cyclopentadienyl)molybdenum. In some embodiments, the molybdenum precursor may comprise at least one halide ligand (e.g., chloride or fluoride), or at least one metal-organic ligand, or at least one organometallic ligand, or may even comprise a cyclic ligand (e.g., cyclopentadienyl). In some embodiments, exposing the substrate to the molybdenum precursor may comprise pulsing the molybdenum precursor (e.g., the molybdenum pentachloride) over the substrate for a time period of less than 20 seconds, or a time period less than 15 seconds, or a time period of less than 10 seconds, or even for a time period of less than 5 seconds. In addition, during the pulsing of the molybdenum precursor over the substrate the flow rate of the molybdenum precursor may be less than 1000 sccm, or less than 500 sccm, or less than 300 sccm, or even less than 100 sccm.

Excess molybdenum source material and reaction byproducts (if any) may be removed from the substrate surface, e.g., by purging with an inert gas. Excess molybdenum source material and any reaction byproducts may be removed with the aid of a vacuum generated by a pumping system.

In a second phase of the deposition cycle ("the nitrogen phase"), the substrate is contacted with a second reactant comprising a nitrogen precursor. In some embodiments of the disclosure, the nitrogen precursor may comprise a nitrogen based plasma (e.g., a plasma comprising nitrogen radicals, ions and atoms) and the nitrogen based plasma may be generated by a remote plasma or alternatively by direct plasma. In some embodiments of the disclosure, methods may further comprising selecting the nitrogen precursor to comprise at least one of ammonia ($NH_3$), hydrazine ($N_2H_4$), triazane ($N_3H_5$), tertbutylhydrazine ($C_4H_9N_2H_3$), methylhydrazine ($CH_3NHNH_2$), and dimethylhydrazine (($CH_3)_2N_2H_2$).

In some embodiments, exposing the substrate to the nitrogen precursor may comprise pulsing the nitrogen precursor (e.g., ammonia) over the substrate for a time period of less than 20 seconds, or a time period of less than 15 seconds, or a time period of less than 10 seconds, or even for a time period of less than 5 seconds. During the pulsing of the nitrogen precursor over the substrate the flow rate of the nitrogen precursor may be less than 1000 sccm, or less than 500 sccm, or less than 300 sccm, or even less than 100 sccm.

The second vapor phase reactant comprising a nitrogen precursor may react with the molybdenum-containing molecules left on the substrate surface. Preferably, in the second phase nitrogen is incorporated into the film by the interaction of the second vapor phase reactant with the monolayer left by the molybdenum source material. In some embodiments, reaction between the second vapor phase reactant comprising a nitrogen precursor and the chemisorbed molybdenum metal species produces a molybdenum nitride thin film ($MoN_x$) over the substrate.

Excess second source chemical and reaction byproducts, if any, are removed from the substrate surface, for example by a purging gas pulse and/or vacuum generated by a pumping system. Purging gas is preferably any inert gas, such as, without limitation, argon (Ar), nitrogen ($N_2$) or helium (He). A phase is generally considered to immediately follow another phase if a purge (i.e., purging gas pulse) or other reactant removal step intervenes.

The deposition cycle in which the substrate is alternatively contacted with the first vapor phase reactant (i.e., the molybdenum precursor) and the second vapor phase reactant (i.e., the nitrogen precursor) may be repeated one or more times until a desired thickness of molybdenum nitride ($MoN_x$) is deposited. It should be appreciated that in some embodiments of the disclosure the order of the contacting of the substrate with the first vapor phase reactant and the second vapor phase reactant may be such that the substrate is first contacted with the second vapor phase reactant followed by the first vapor phase reactant. In addition in some embodiments the ALD process may comprise contacting the substrate with the first vapor phase reactant one or more times prior to contacting the substrate with the second vapor phase reactant one or more times and similarly may alternatively comprise contacting the substrate with the second vapor phase reactant one or more times prior to contacting the substrate with the first vapor phase reactant one or more times.

In some embodiments of the disclosure the ALD process for depositing molybdenum nitride films ($MoN_x$) may comprise an additional third phase. For example, in some embodiments one deposition cycle may comprise exposing the substrate to a first reactant, removing any unreacted first reactant and reaction byproducts from the reaction space, exposing the substrate to a second reactant, followed by a second removal step and exposing the substrate to a third reactant, followed by a third removal step. The first reactant may comprise a molybdenum precursor and the second reactant may comprise a nitrogen precursor as previously described herein. In some embodiments, a third phase may be utilized in the ALD-process for depositing molybdenum nitride films ($MoN_x$) and the third phase may comprise a reducing precursor.

In a third phase of the deposition cycle ("the reducing phase"), the substrate is contacted with a third vapor phase reactant comprising a reducing precursor. In some embodiments of the disclosure, methods may further comprise selecting the reducing precursor to comprise at least one of hydrogen ($H_2$), silane ($SiH_4$), disilane ($Si_2H_6$), trisilane ($Si_3H_8$), tetrasilane ($Si_4H_{10}$) or higher order silanes with the general empirical formula $Si_xH_{(2x+2)}$. In general the reducing precursor may comprise a precursor which comprises a reducing agent, such as, for example, acetylene ($C_2H_2$). In some embodiments of the disclosure, the reducing precursor may comprise a hydrogen ($H_2$) based plasma which may comprise atomic hydrogen, hydrogen radicals, hydrogen plasma and hydrogen ions. For example, the hydrogen ($H_2$) based plasma may be generated utilizing a direct plasma or alternatively a remote plasma. In alternative embodiments of the disclosure, the reducing precursor may not comprise a hydrogen plasma, hydrogen radicals, atomic hydrogen or hydrogen ions. For example, the reducing precursor may not be generated by a direct plasma, a remote plasma, hot-wire or alternative means for dissociation molecular hydrogen.

In some embodiments, exposing the substrate to the reducing precursor may comprise pulsing the reducing precursor over the substrate for a time period of less than 60 seconds, or a time period of less than 30 seconds, or a time period of less than 10 seconds, or a time period of less than 5 seconds, or even for a time period of less than 1 second. During the pulsing of the reducing precursor over the substrate, the flow rate of the reducing precursor may be less than 1000 sccm, or less than 500 sccm, or less than 300 sccm, or even less than 100 sccm.

The third vapor phase reactant comprising a reducing precursor may react with the molybdenum nitride film left on the substrate surface. Preferably, in the third phase the third vapor phase reactant, comprising a reducing precursor, interacts with the molybdenum nitride film ($MoN_x$). In some embodiments, the interaction between the third vapor phase reactant comprising a reducing precursor and the molybdenum nitride film reduces the electrical resistivity of the molybdenum nitride film. For example, in some embodiments of the disclosure, utilizing a third vapor phase reactant comprising a reducing precursor the methods may comprise forming a molybdenum nitride film to have an electrical resistivity of less than 3000μΩ-cm, or less than 2000μΩ-cm, or less than 1200μΩ-cm, or less than 800μΩ-cm, or less than 600μΩ-cm, or less than 400μΩ-cm, or even less than 200μΩ-cm.

Excess third source chemical and reaction byproducts, if any, are removed from the substrate surface, for example by a purging gas pulse and/or vacuum generated by a pumping system. Purging gas is preferably any inert gas, such as, without limitation, argon (Ar), nitrogen ($N_2$) or helium (He). A phase is generally considered to immediately follow another phase if a purge (i.e., purging gas pulse) or other reactant removal step intervenes.

In the example embodiments described herein the ALD deposition cycle may comprise a sequence of contacting the substrate with a first vapor phase reactant, followed by a first purging cycle, contacting the substrate with a second vapor phase reactant, followed by a second purging cycle and contacting the substrate with a third vapor phase reactant followed by a third purging cycle. In alternative embodiments of the disclosure the ALD deposition cycle may be performed by alternate sequencing of the first, second and third vapor phase reactants with the substrate, with intervening purging cycles. In addition, the ALD deposition cycle may comprise one or more repetitions of each contacting step prior to a subsequent purging cycle.

In some embodiments of the disclosure the third phase of the deposition cycle, comprising the contacting of the substrate with a third vapor phase reactant comprising a reducing precursor may be performed concurrently with the first phase and/or with the second phase of the deposition cycle. For example, forming the molybdenum nitride film on the substrate by ALD may comprise contacting the substrate with a molybdenum precursor whilst optionally also contacting the substrate with a reducing precursor, such that the molybdenum precursor and the reducing precursor simultaneously contact the substrate. In addition, in some embodiments, forming the molybdenum nitride film on the substrate by ALD may comprise contacting the substrate with a nitrogen precursor whilst optionally also contacting the substrate with a reducing precursor, such that the nitrogen precursor and the reducing precursor simultaneously contact the substrate.

The ALD processes described herein, utilizing a molybdenum precursor and a nitrogen precursor (with an optional reducing precursor) to form a molybdenum nitride ($MoN_x$), may be performed in an ALD deposition system with a heated substrate. For example, in some embodiments, methods may comprise heating the substrate to temperature of greater than 400° C., or heating the substrate to a temperature of greater than 450° C., or heating the substrate to a temperature of greater than 500° C., or even heating the substrate to a temperature of greater than 550° C.

The deposition rate of the molybdenum nitride film by ALD, which is typically presented as Å/pulsing cycle, depends on a number of factors including, for example, on the number of available reactive surface sites or active sites on the surface and bulkiness of the chemisorbing molecules. In some embodiments, the deposition rate of such molybdenum nitride films may range from about 0.1 to about 5.0 Å/pulsing cycle. In some embodiments, the deposition rate can be about 0.1, 0.2, 0.3, 0.5, 1.0, 1.5, 2.0, 2.5, 3.0, 3.5, 4.0, 4.5, 5.0 Å/pulsing cycle.

The molybdenum nitride formed by the embodiments of the disclosure may take the form $MoN_x$ wherein x may range from approximately 0.75 to approximately 1.8, or wherein x may range from approximately 0.8 to approximately 1.5, or wherein x may range from 0.9 to approximately 1.3, or alternatively wherein x may range from approximately 0.95 to approximately 1.2. The elemental composition ranges for $MoN_x$ may comprise Mo from about 30 atomic % to about 60 atomic %, or from about 35 atomic % to about 55 atomic %, or even from about 40 atomic % to about 50 atomic %. Alternatively the elemental composition ranges for $MoN_x$ may comprise N from about 25 atomic % to about 65 atomic %, or N from about 30 atomic % to about 60 atomic %, or even N from about 35 atomic % to about 55 atomic %. In additional embodiments the $MoN_x$ may comprise less than about 20 atomic % oxygen, less than about 10 atomic % oxygen, less than about 5 atomic % oxygen, or even less than about 2 atomic % oxygen. In further embodiments, the $MoN_x$ may comprise less than about 10 atomic % hydrogen, or less than about 5 atomic % of hydrogen, or less than about 2 atomic % of hydrogen, or even less than about 1 atomic % of hydrogen. In some embodiments, the $MoN_x$ may comprise Halide/Cl less than about 10 atomic %, or Halide/Cl less than about 5 atomic %, Halide/Cl less than about 1 atomic %, or even Halide/Cl less than about 0.5 atomic %. In yet further embodiments, the $MoN_x$ may comprise less than about 10 atomic % carbon, or less than about 5 atomic % carbon, or less than about 2 atomic % carbon, or less than about 1 atomic % of carbon, or even less than about 0.5 atomic % carbon. In the embodiments outlined herein, the atomic concentration of an element may be determined utilizing Rutherford backscattering (RBS).

In some embodiments of the invention the molybdenum nitride films formed by the atomic layer deposition processes of the disclosure may have a cubic crystallographic structure, whereas in alternative embodiments the molybdenum nitride films formed by the methods of the disclosure may have a tetragonal crystallographic structure.

In some embodiments of the disclosure, forming the molybdenum nitride film may comprise forming the molybdenum nitride film to a thickness of less than 100 Angstroms, or to a thickness of less than 50 Angstroms, or to a thickness of less than 30 Angstroms.

The molybdenum nitride films formed by the ALD processes disclosed herein can be utilized in a variety of contexts, such as in the formation of gate electrode structures. One of skill in the art will recognize that the processes described herein are applicable to many contexts, including fabrication of PMOS transistors including planar devices as well as multiple gate transistors, such as FinFETs.

As a non-limiting example, and with reference to FIG. 1, a semiconductor device structure 100 may comprise a transistor structure and may include a source region 102, a drain region 104, a channel region 106 there between. A transistor gate structure 108 may comprise a gate electrode 110 which may be separated from the channel region 106 by a gate dielectric 112. According to the teaching of the present disclosure, the gate electrode 110 may comprise a molybdenum nitride film formed by an atomic layer deposition process as described herein. As shown in FIG. 1, in some embodiments the transistor gate structure 108 may further comprise one or more additional conductive layers 114 formed on the gate electrode 110. The one or more additional conductive layers 114 may comprise at least one of polysilicon, a refractory metal, a transition metal carbide and a transition metal nitride.

In some embodiments, the semiconductor device structure 100 may comprise a PMOS transistor, the PMOS transistor may further comprise the transistor gate structure 108. The PMOS transistor gate structure 108 may comprise a gate electrode 110 comprising a molybdenum nitride film and a gate dielectric 112 disposed between the molybdenum nitride film and a semiconductor body 116.

As a non-limiting example embodiment the semiconductor device structure 100 may comprise a silicon (Si) semiconductor body 116, a hafnium oxide (HfO$_2$) gate dielectric 112, a molybdenum nitride (MoN$_x$) gate electrode 110 and an additional conductive layer 114 comprising titanium nitride (TiN).

In some embodiments of the disclosure, forming a semiconductor device structure, such as semiconductor device structure 100, may comprise forming a gate electrode structure comprising a molybdenum nitride film, the gate electrode structure having an effective work function greater than approximately 4.9 eV, or greater than approximately 5.0 eV, or greater than approximately 5.1 eV, or greater than approximately 5.2 eV, or greater than approximately 5.3 eV, or even greater than approximately 5.4 eV. In some embodiments, the effective work function values given above may be demonstrated for an electrode structure comprising a molybdenum nitride film with a thickness of less than approximately 100 Angstroms, or less than approximately 50 Angstroms, or less than approximately 40 Angstroms, or even less than approximately 30 Angstroms. It should be noted that the embodiments of the disclosure allow for the formation of gate electrode structures comprising thin molybdenum nitride films with increased effective work function, for example, in some embodiments methods may comprise forming a gate electrode structure comprising a molybdenum nitride film with a thickness of less than 100 Angstroms with an effective work function of greater than approximately 5.0 eV. In further embodiments, methods may comprise forming the gate electrode structure comprising a molybdenum nitride film with a thickness of less than 100 Angstroms with an effective work function of greater than approximately 5.4 eV. In yet further embodiments, methods may comprise forming the gate electrode structure comprising a molybdenum nitride film with a thickness of less than 30 Angstroms with an effective work function of greater than approximately 5.0 eV.

Figure 2:
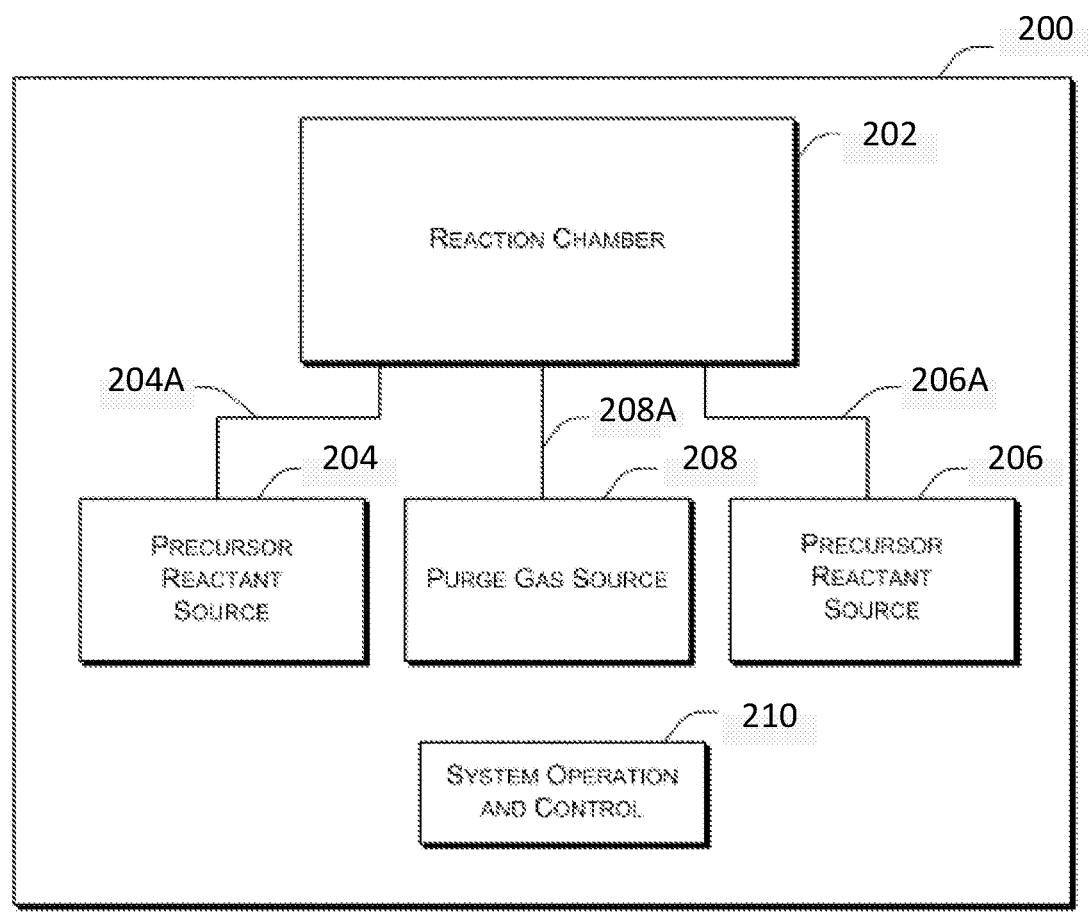
FIG. 2 illustrates a reaction system configured to perform certain embodiments of the disclosure.

Embodiments of the disclosure may also include a reaction system configured for forming the molybdenum nitride films of the present disclosure. In more detail, FIG. 2 schematically illustrates a reaction system 200 including a reaction chamber 202 that further includes mechanism for retaining a substrate (not shown) under predetermined pressure, temperature, and ambient conditions, and for selectively exposing the substrate to various gases. A precursor reactant source 204 may be coupled by conduits or other appropriate means 204A to the reaction chamber 202, and may further couple to a manifold, valve control system, mass flow control system, or mechanism to control a gaseous precursor originating from the precursor reactant source 204. A precursor (not shown) supplied by the precursor reactant source 204, the reactant (not shown), may be liquid or solid under room temperature and standard atmospheric pressure conditions. Such a precursor may be vaporized within a reactant source vacuum vessel, which may be maintained at or above a vaporizing temperature within a precursor source chamber. In such embodiments, the vaporized precursor may be transported with a carrier gas (e.g., an inactive or inert gas) and then fed into the reaction chamber 202 through conduit 204A. In other embodiments, the precursor may be a vapor under standard conditions. In such embodiments, the precursor does not need to be vaporized and may not require a carrier gas. For example, in one embodiment the precursor may be stored in a gas cylinder. The reaction system 200 may also include additional precursor reactant sources, such precursor reactant source 206 which may also be couple to the reaction chamber by conduits 206A as described above.

A purge gas source 208 may also be coupled to the reaction chamber 202 via conduits 208A, and selectively supplies various inert or noble gases to the reaction chamber 202 to assist with the removal of precursor gas or waste gasses from the reaction chamber. The various inert or noble gasses that may be supplied may originate from a solid, liquid or stored gaseous form.

The reaction system 200 of FIG. 2, may also comprise a system operation and control mechanism 210 that provides electronic circuitry and mechanical components to selectively operate valves, manifolds, pumps and other equipment included in the reaction system 200. Such circuitry and components operate to introduce precursors, purge gasses from the respective precursor sources 204, 206 and purge gas source 208. The system operation and control mechanism 210 also controls timing of gas pulse sequences, temperature of the substrate and reaction chamber, and pressure of the reaction chamber and various other operations necessary to provide proper operation of the reaction system 200. The operation and control mechanism 210 can include control software and electrically or pneumatically controlled valves to control flow of precursors, reactants and purge gasses into and out of the reaction chamber 202. The control system can include modules such as a software or hardware component, e.g., a FPGA or ASIC, which performs certain tasks. A module can advantageously be configured to reside on the addressable storage medium of the control system and be configured to execute one or more processes.

Those of skill in the relevant arts appreciate that other configurations of the present reaction system are possible, including different number and kind of precursor reactant sources and purge gas sources. Further, such persons will also appreciate that there are many arrangements of valves, conduits, precursor sources, purge gas sources that may be used to accomplish the goal of selectively feeding gasses into reaction chamber 202. Further, as a schematic representation of a reaction system, many components have been omitted for simplicity of illustration, and such components may include, for example, various valves, manifolds, purifiers, heaters, containers, vents, and/or bypasses.

The example embodiments of the disclosure described above do not limit the scope of the invention, since these embodiments are merely examples of the embodiments of the invention, which is defined by the appended claims and their legal equivalents. Any equivalent embodiments are intended to be within the scope of this invention. Indeed, various modifications of the disclosure, in addition to those shown and described herein, such as alternative useful combination of the elements described, may become apparent to those skilled in the art from the description. Such modifications and embodiments are also intended to fall within the scope of the appended claims.

What is claimed is:

1. A method comprising:
    forming a molybdenum and nitrogen-containing film on a substrate by atomic layer deposition, wherein forming the molybdenum and nitrogen-containing film comprises:
    contacting the substrate with a first vapor phase reactant comprising a molybdenum precursor;
    after contacting the substrate with the first vapor phase reactant, contacting the substrate with a second vapor phase reactant; and
    at the same time as or after contacting the substrate with the second vapor phase reactant, contacting the substrate with a third vapor phase reactant comprising a reducing precursor,
    wherein the molybdenum precursor comprises a binary molybdenum halide precursor.

2. The method of claim 1, wherein the second vapor phase reactant is selected from the group comprising ammonia ($NH_3$), hydrazine ($N_2H_4$), triazane ($N_3H_5$), tertbutylhydrazine ($C_4H_9N_2H_3$), methylhydrazine ($CH_3NHNH_2$), and dimethylhydrazine (($CH_3$)$_2N_2H_2$).

3. The method of claim 1, wherein the reducing precursor is selected from the group consisting of hydrogen gas ($H_2$), silane ($SiH_4$), disilane ($Si_2H_6$), trisilane ($Si_3H_8$), tetrasilane ($Si_4H_8$), and acetylene ($C_2H_2$).

4. The method of claim 1, wherein the second vapor phase reactant is selected from the group comprising hydrazine ($N_2H_4$), triazane ($N_3H_5$), tertbutylhydrazine ($C_4H_9N_2H_3$), methylhydrazine ($CH_3NHNH_2$), and dimethylhydrazine (($CH_3$)$_2N_2H_2$.

5. The method of claim 1, wherein the molybdenum precursor comprises a molybdenum chloride.

6. The method of claim 1, wherein the molybdenum precursor comprises at least one of molybdenum trichloride ($MoCl_3$), molybdenum tetrachloride ($MoCl_4$), molybdenum pentachloride ($MoCl_5$), and molybdenum hexachloride ($MoCl_6$).

7. The method of claim 1, wherein the molybdenum precursor comprises a molybdenum fluoride.

8. The method of claim 1, wherein the molybdenum precursor comprises molybdenum hexacarbonyl ($Mo(CO)_6$).

9. The method of claim 1, wherein the molybdenum precursor comprises at least one halide ligand.

10. The method of claim 1, wherein the molybdenum precursor comprises least one organometallic ligand.

11. The method of claim 1, wherein the molybdenum precursor comprises a cyclic ligand.

12. The method of claim 1, wherein the molybdenum precursor is selected from the group consisting of molybdenum trichloride ($MoCl_3$), molybdenum tetrachloride ($MoCl_4$), molybdenum hexachloride ($MoCl_6$) and molybdenum hexafluoride ($MoF_6$).

13. The method of claim 1, wherein contacting the substrate with the third vapor phase reactant is performed after contacting the substrate with the second vapor phase reactant.

14. A reaction system configured for forming the molybdenum nitride film of claim 1.

15. A method comprising:
    forming a molybdenum and nitrogen-containing film on a substrate by atomic layer deposition, wherein forming the molybdenum and nitrogen-containing film comprises:
    contacting the substrate with a first vapor phase reactant comprising a molybdenum precursor;
    after contacting the substrate with the first vapor phase reactant, contacting the substrate with a second vapor phase reactant; and
    at the same time as or after contacting the substrate with the second vapor phase reactant, contacting the substrate with a third vapor phase reactant comprising a reducing precursor, wherein the molybdenum precursor comprises at least one halide ligand,
    wherein the halide ligand comprises chloride or fluoride.

16. A method comprising:
    forming a molybdenum and nitrogen-containing film on a substrate by atomic layer deposition, wherein forming the molybdenum and nitrogen-containing film comprises:
    contacting the substrate with a first vapor phase reactant comprising a molybdenum precursor;
    after contacting the substrate with the first vapor phase reactant, contacting the substrate with a second vapor phase reactant; and
    at the same time as or after contacting the substrate with the second vapor phase reactant, contacting the substrate with a third vapor phase reactant comprising a reducing precursor,
    wherein the molybdenum precursor comprises at least one metal-organic ligand.

17. A semiconductor device structure comprising:
    a PMOS transistor gate structure, comprising:
    a molybdenum nitride film formed according to the method of claim 1;
    a semiconductor body; and
    a gate dielectric disposed between the molybdenum nitride film and the semiconductor body,
    wherein the molybdenum nitride film comprises between 30 atomic % and 60 atomic % molybdenum.

18. The semiconductor device structure of claim 17, wherein the molybdenum nitride film comprises between 40 atomic % and 50 atomic % molybdenum.

* * * * *